(12) United States Patent
Kamei

(10) Patent No.: US 6,512,698 B2
(45) Date of Patent: Jan. 28, 2003

(54) SEMICONDUCTOR DEVICE

(75) Inventor: Teruhiko Kamei, Yokohama (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/885,859

(22) Filed: Jun. 20, 2001

(65) Prior Publication Data

US 2002/0014636 A1 Feb. 7, 2002

(30) Foreign Application Priority Data

Jun. 21, 2000 (JP) ........................................ 2000-186732

(51) Int. Cl.$^7$ ................................................ G11C 16/00
(52) U.S. Cl. ............................. 365/185.23; 365/189.11; 365/226
(58) Field of Search ........................ 365/185.23, 185.18, 365/185.09, 226, 189.11, 201

(56) References Cited

U.S. PATENT DOCUMENTS

| | | | | |
|---|---|---|---|---|
| 5,430,402 A | * | 7/1995 | Tedrow et al. | 365/226 |
| 5,444,655 A | * | 8/1995 | Yoshikawa | 365/189.09 |
| 5,777,930 A | * | 7/1998 | Sugiura et al. | 365/189.11 |
| 6,166,960 A | * | 12/2000 | Marneweck et al. | 365/185.28 |

* cited by examiner

*Primary Examiner*—Tan T. Nguyen
(74) *Attorney, Agent, or Firm*—Harness, Dickey & Pierce, P.L.C.

(57) ABSTRACT

A semiconductor device includes a charge pump circuit 1; a voltage feeding terminal 4; a first impedance device QN3 for switching on/off an electric current path between the charge pump circuit 1 and a non-volatile memory; a second impedance device QN2 for switching on/off an electric current path between the voltage feeding terminal and the non-volatile memory; and a control circuit 5, to which a voltage is supplied from the charge pump circuit 1, for controlling the first and second impedance devices QN3 and QN2.

10 Claims, 2 Drawing Sheets

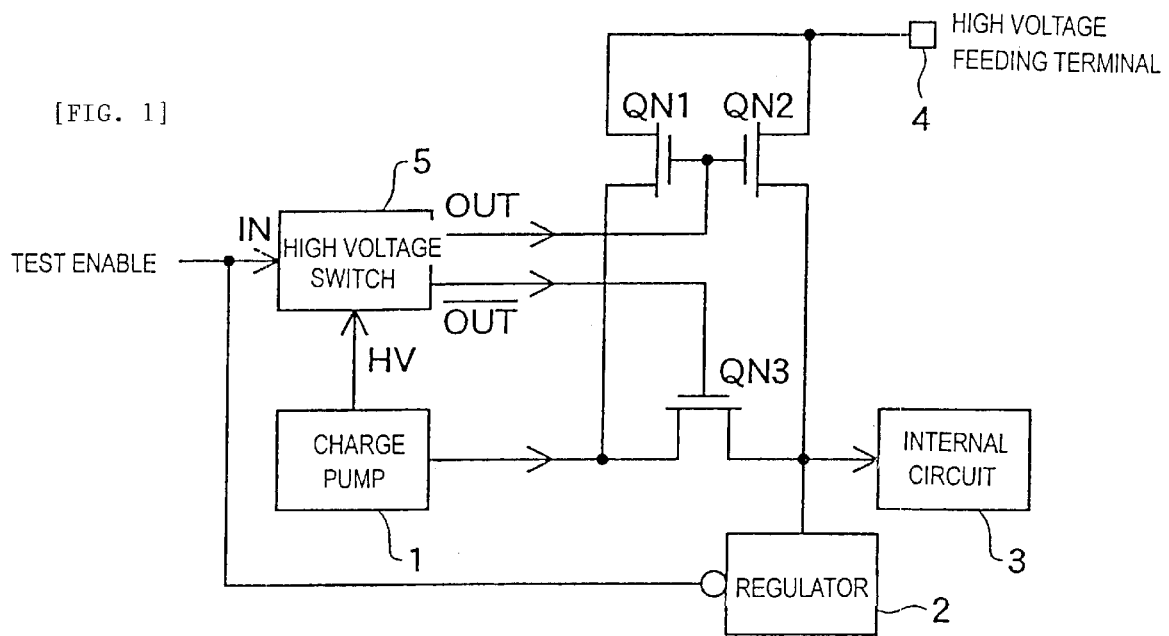
[FIG. 1]
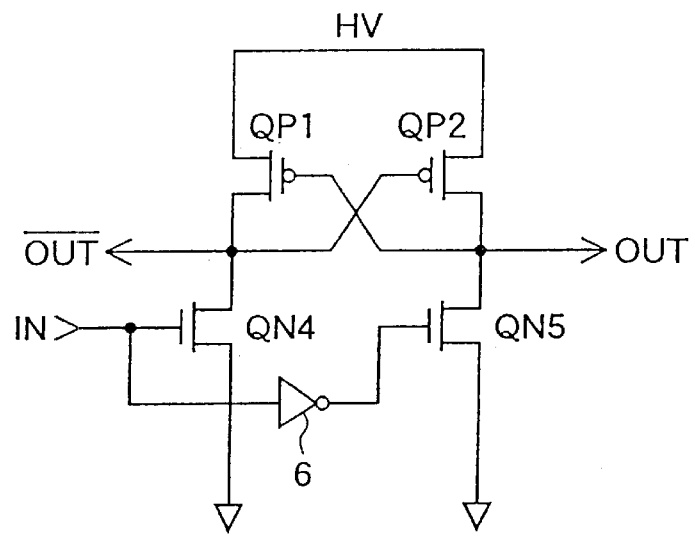
[FIG. 2]

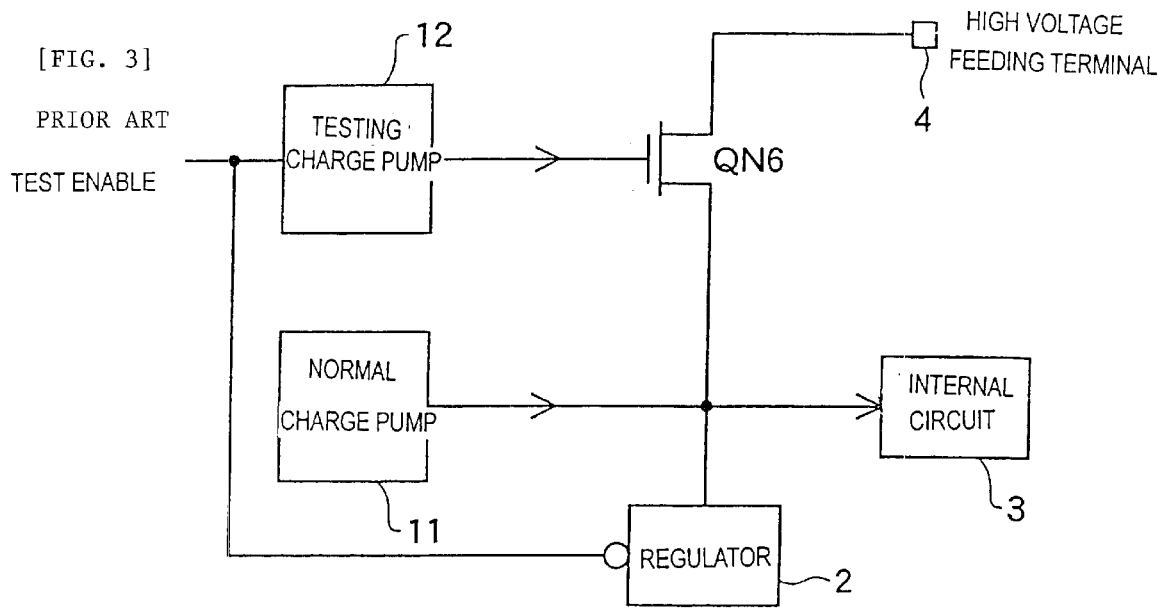
[FIG. 3] PRIOR ART
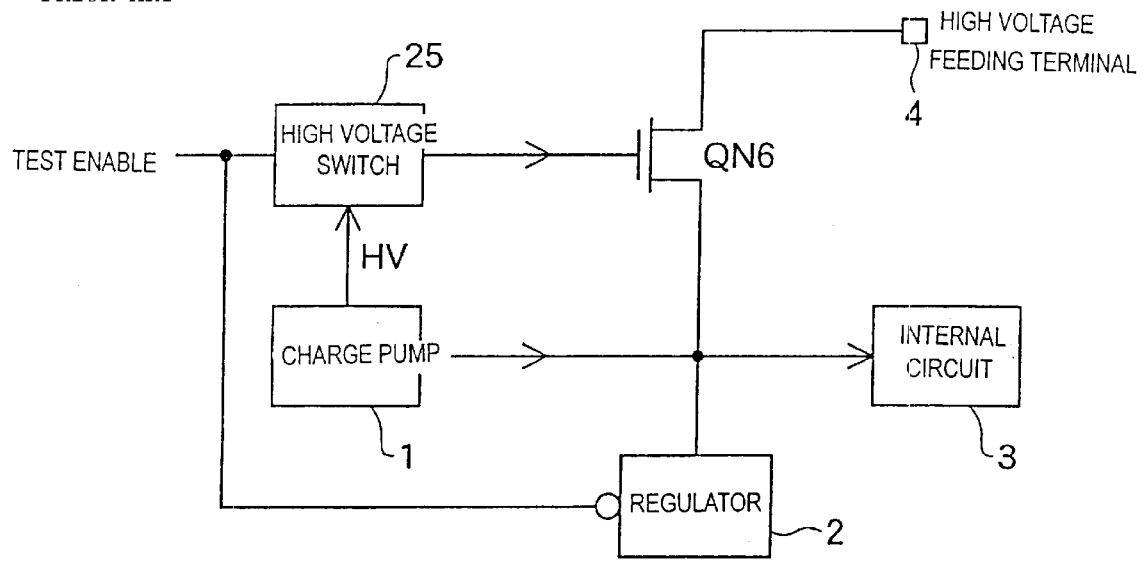
[FIG. 4] PRIOR ART

SEMICONDUCTOR DEVICE

BACKGROUND OF THE INVENTION

1. Technical Field of the Invention

The present invention relates to semiconductor devices, and more specifically, it relates to a semiconductor device with a non-volatile memory.

2. Description of the Related Art

In order to write data on a non-volatile memory such as a flash memory, a high voltage of 12 to 18 V is necessary. Since the supply voltage of recent semiconductor devices ranges from 3 to 5 V, it is necessary to boost the supply voltage of semiconductor devices in order to obtain a high enough voltage to drive the non-volatile memory. In a normal mode, a built-in charge pump circuit in the semiconductor device is generally used to obtain high voltages. In contrast, in a check mode in which the operation of the semiconductor device is checked, the operation of each circuit portion must be checked. It is therefore necessary to supply a high voltage from the outside.

In FIG. 3, an example of the structure of such a conventional semiconductor device is shown. As shown in FIG. 3, the semiconductor device includes a normal charge pump circuit 11 for generating a high voltage in order to write data on a non-volatile memory in a normal mode. The output voltage of the normal charge pump circuit 11 is stabilized by a regulator 2, and the voltage is supplied to an internal circuit 3 which includes the non-volatile memory. In contrast, when performing a writing test to write to the non-volatile memory in a test mode, a test enable signal becomes active, and a high voltage is applied to a high voltage feeding terminal 4. When the test enable signal becomes active, the regulator 2 stops operating, and a testing charge pump circuit 12 starts boosting the voltage. In the test mode, the normal charge pump circuit 11 does not operate. The voltage boosted by the testing charge pump circuit 12 is applied to the gate of an N-channel MOS transistor QN6. Accordingly, the transistor QN6 is turned on, and the high voltage applied to the high voltage feeding terminal 4 is supplied to the internal circuit 3.

By providing the testing charge pump circuit 12 in addition to the normal charge pump circuit 11, the gate voltage of the transistor QN6 does not vary even when a high current flows through the internal circuit 3. Thus, it is possible to reliably control the on/off state of high voltage supplied from the outside. In contrast, there is a drawback in that the chip area of the semiconductor device is increased in order to provide the testing charge pump circuit 12.

In FIG. 4, another example of the structure of a conventional semiconductor device is shown. As shown in FIG. 4, the semiconductor device includes a high voltage switch 25 in place of the testing charge pump circuit 12 shown in FIG. 3. In a test mode, a high voltage HV is supplied from a charge pump circuit 1 to the high voltage switch 25, and the high voltage switch 25 starts operating. The output voltage of the high voltage switch 25 is applied to the gate of an N-channel MOS transistor QN6 which is used as a pass gate. Accordingly, the transistor QN6 is turned on, and the high voltage applied to the high voltage feeding terminal 4 is supplied to the internal circuit 3.

By providing the high voltage switch 25 which operates in response to the supply of a high voltage from the charge pump circuit 1, the testing charge pump circuit 12 shown in FIG. 3 can be omitted. In contrast, when a high current which exceeds the capacity of the charge pump circuit 1 flows through the internal circuit 3, the output voltage of the high voltage switch 25, that is, the gate voltage of the transistor QN6, decreases. It therefore becomes impossible to reliably control the on/off state of a high voltage.

Accordingly, it is an object of the present invention to provide a semiconductor device with a non-volatile memory, in which the on/off state of a high voltage supplied from the outside is reliably controlled, without increasing the chip area to a large extent.

SUMMARY OF THE INVENTION

In order to solve the foregoing problems, a semiconductor device according to the present invention is a semiconductor device with a non-volatile memory, including a charge pump circuit for generating a predetermined voltage in the semiconductor device; a voltage feeding terminal to which a voltage is applied from the outside; a first impedance device for switching on/off an electric current path between the charge pump circuit and the non-volatile memory; a second impedance device for switching on/off an electric current path between the voltage feeding terminal and the non-volatile memory; and a control circuit, to which the voltage is applied from the charge pump circuit, for controlling the first and second impedance devices.

The control circuit may include a switch circuit for turning off the first impedance device and turning on the second impedance device in accordance with a signal which becomes active in a test mode. The semiconductor device may further include a third impedance device controlled by the control circuit, the third impedance device switching on/off an electric current path between the charge pump circuit and the voltage feeding terminal. Also, the semiconductor device may further include a regulator for stabilizing the voltage supplied in a normal mode from the charge pump circuit to the non-volatile memory through the first impedance device.

According to the present invention, a semiconductor device with a non-volatile memory can reliably control the on/off state of a high voltage supplied from the outside, without increasing the chip area to a large extent.

BRIEF DESCRIPTION OF THE DRAWINGS

FIG. 1 is a block diagram of the structure of a semiconductor device according to an embodiment of the present invention.

FIG. 2 is a circuit diagram of a high voltage switch used in the semiconductor device shown in FIG. 1.

FIG. 3 is a block diagram of an example of the structure of a conventional semiconductor device.

FIG. 4 is a block diagram of another example of the structure of a conventional semiconductor device.

DETAILED DESCRIPTION OF THE PREFERRED EMBODIMENT

The present invention will be understood from the following description of a preferred embodiment with reference to the drawings. The same reference numerals are given to similar components, and repeated descriptions are omitted.

In FIG. 1, the structure of a semiconductor device according to an embodiment of the present invention is shown. As shown in FIG. 1, the semiconductor device includes a charge pump circuit 1 for generating a high voltage to write data on a non-volatile memory in a normal mode. The output voltage of the charge pump circuit 1 is stabilized by a regulator 2, and the voltage is supplied to an internal circuit 3 which includes the non-volatile memory.

In contrast, when performing a writing test to write to the non-volatile memory in a test mode, a test enable signal becomes active, and a high voltage is applied to a high voltage feeding terminal 4. When the test enable signal becomes active, the regulator 2 stops operating. A high voltage HV is supplied from the charge pump circuit 1 to a high voltage switch 5, and the high voltage switch 5 starts operating. By providing the high voltage switch 5, the testing charge pump circuit 12 shown in FIG. 3 can be omitted.

A high-level signal OUT which is output from the high voltage switch 5 when the test enable signal becomes active is supplied to the gates of N-channel MOS transistors QN1 and QN2. Accordingly, the transistor QN2, which is used as a pass gate, is turned on, and a high voltage applied to the high voltage feeding terminal 4 is supplied to the internal circuit 3. Also, the transistor QN1 is turned on. When the output voltage of the charge pump circuit 1 is increased to a great extent, a reverse current flows from the charge pump circuit 1 to the high voltage feeding terminal 4.

A low-level signal OUT bar, which is output from the high voltage switch 5 when the test enable signal becomes active, is supplied to the gate of an N-channel MOS transistor QN3. Accordingly, the transistor QN3 is turned off, and the charge pump circuit 1 and the internal circuit 3 are disconnected from each other. Even when a high current flows through the internal circuit 3, the output of the charge pump circuit 1 does not decrease. It is also possible to reliably control the on/off state of a high voltage supplied from the outside.

Next, the structure of the high voltage switch 5 used in the semiconductor device shown in FIG. 1 is described with reference to FIG. 2. An input IN of the high voltage switch 5 is connected to the gate of an N-channel MOS transistor QN4. Also, the input is connected to the gate of an N-channel MOS transistor QN5 through an inverter 6. P-channel MOS transistors QP1 and QP2, which form a complimentary pair, are connected to the transistors QN4 and QN5. The nodes become an inversion output OUT bar and a non-inversion output OUT. A high voltage HV is supplied from the charge pump circuit 1 to the sources of the transistors QP1 and QP2. The inversion output OUT bar and the non-inversion output OUT of the high voltage switch 5 are connected to the gates of the transistors QP2 and QP1, respectively, thereby forming a forward feedback loop.

With this arrangement, when a high-level test enable signal is input to the input IN of the high voltage switch 5, the inversion output OUT bar of the high voltage switch 5 drops to a low level, and the non-inversion output OUT rises to a high level.

As described above, according to the present invention, a semiconductor device with a non-volatile memory can reliably control the on/off state of a high voltage supplied from the outside, without increasing the chip area to a large extent.

What is claimed is:

1. A semiconductor device with a non-volatile memory, comprising:
   a charge pump circuit for generating a predetermined voltage in said semiconductor device;
   a voltage feeding terminal to which a voltage is applied from the outside;
   a first impedance device for switching on/off an electric current path between said charge pump circuit and said non-volatile memory;
   a second impedance device for switching on/off an electric current path between said voltage feeding terminal and said non-volatile memory; and
   a control circuit, to which a voltage is applied from said charge pump circuit, for controlling said first and second impedance devices,
   wherein said control circuit includes a switch circuit for turning off said first impedance device and turning on said second impedance device in accordance with a signal which becomes active in a test mode.

2. A semiconductor device according to claim 1, further comprising a third impedance device controlled by said control circuit, said third impedance device switching on/off an electric current path between said charge pump circuit and said voltage feeding terminal.

3. A semiconductor device with a non-volatile memory, comprising:
   a charge pump circuit for generating a predetermined voltage in said semiconductor device;
   a voltage feeding terminal to which a voltage is applied from the outside;
   a first impedance device for switching on/off an electric current path between said charge pump circuit and said non-volatile memory;
   a second impedance device for switching on/off an electric current path between said voltage feeding terminal and said non-volatile memory;
   a control circuit, to which a voltage is applied from said charge pump circuit, for controlling said first and second impedance devices; and
   a regulator for stabilizing the voltage supplied in a normal mode from said charge pump circuit to said non-volatile memory through said first impedance device.

4. A semiconductor device with a non-volatile memory comprising:
   a charge pump circuit
   a control circuit;
   a voltage feeding terminal;
   a first impedance device comprising a transistor having a source coupled to said charge pump circuit, a drain coupled to said non-volatile memory, and a gate coupled to said control circuit; and
   a second impedance device coupled to said voltage feeding terminal, said control circuit and said non-volatile memory.

5. The device of claim 4 wherein said second impedance device further comprises a transistor having a source coupled to said voltage feeding terminal, a drain coupled to said non-volatile memory, and a gate coupled to said control circuit.

6. The device of claim 5 further comprising a third impedance device coupled to said voltage feeding terminal and said charge pump circuit.

7. The device of claim 6 wherein said third impedance device further comprises a transistor having a gate coupled to said control circuit.

8. The device of claim 4 wherein said second impedance device further comprises a transistor having a source coupled to said voltage feeding terminal, a drain coupled to said non-volatile memory, and a gate coupled to said control circuit.

9. The device of claim 4 further comprising a third impedance device coupled to said voltage feeding terminal and said charge pump circuit.

10. The device of claim 9 wherein said third impedance device further comprises a transistor having a gate coupled to said control circuit.

* * * * *